United States Patent
Lee et al.

(10) Patent No.: US 11,380,811 B2
(45) Date of Patent: Jul. 5, 2022

(54) ENERGY CONVERSION MATERIAL

(71) Applicant: Research & Business Foundation Sungkyunkwan University, Suwon-si (KR)

(72) Inventors: Jaichan Lee, Seoul (KR); Sangwoo Kim, Yongin-si (KR); Bongwook Chung, Seoul (KR); Jae Young Park, Jeju-si (KR); Tae Yun Kim, Incheon (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 354 days.

(21) Appl. No.: 15/976,066

(22) Filed: May 10, 2018

(65) Prior Publication Data

US 2018/0337300 A1 Nov. 22, 2018

(30) Foreign Application Priority Data

May 19, 2017 (KR) .................. 10-2017-0062423

(51) Int. Cl.
| | |
|---|---|
| *H01L 25/00* | (2006.01) |
| *H01L 31/00* | (2006.01) |
| *H02N 6/00* | (2006.01) |
| *H01L 31/06* | (2012.01) |
| *H01L 41/18* | (2006.01) |
| *H01L 41/083* | (2006.01) |
| *H01L 35/22* | (2006.01) |
| *H01L 35/04* | (2006.01) |

(Continued)

(52) U.S. Cl.
CPC ............ *H01L 31/06* (2013.01); *H01L 31/028* (2013.01); *H01L 31/032* (2013.01); *H01L 31/036* (2013.01); *H01L 31/03125* (2013.01); *H01L 35/04* (2013.01); *H01L 35/16* (2013.01); *H01L 35/22* (2013.01); *H01L 41/083* (2013.01); *H01L 41/18* (2013.01); *H01L 51/005* (2013.01); *H01L 51/0591* (2013.01); *H01L 51/42* (2013.01)

(58) Field of Classification Search
None
See application file for complete search history.

(56) References Cited

U.S. PATENT DOCUMENTS 6,400,489 B1 * 6/2002 Suzuki ............... G02F 1/21
 204/157.15
2018/0248497 A1 * 8/2018 Hendriks ............. H01L 41/083

FOREIGN PATENT DOCUMENTS

| JP | 2013-545825 A | 12/2013 |
|---|---|---|
| KR | 10-2012-0100294 A | 9/2012 |
| KR | 10-1257318 B1 | 6/2013 |

OTHER PUBLICATIONS

Bandara et al., (Photoisomerization in different classes of Azobenzene), 2011.*

(Continued)

*Primary Examiner* — Angelo Trivisonno
(74) *Attorney, Agent, or Firm* — NSIP Law

(57) ABSTRACT

The present disclosure relates to an energy conversion material including: a pair of 2-dimensional active layers; and a property control layer positioned between the 2-dimensional active layers, and the property control layer is changed in any one or more of structure and state depending on an external environmental factor and performs reversible switching between the 2-dimensional active layers.

12 Claims, 10 Drawing Sheets

(51) Int. Cl.
  *H01L 31/0312* (2006.01)
  *H01L 31/032* (2006.01)
  *H01L 35/16* (2006.01)
  *H01L 31/028* (2006.01)
  *H01L 31/036* (2006.01)
  *H01L 51/00* (2006.01)
  H01L 51/42 (2006.01)
  H01L 51/05 (2006.01)

(56) References Cited

OTHER PUBLICATIONS

Bandara et al., (Photoisomerization in different classes of Azobenzene), 2011 (Year: 2011).*
Korean Office Action dated Aug. 22, 2018, in corresponding Korean Application No. 10-2017-0062423 (5 pages, in Korean).

* cited by examiner

ENERGY CONVERSION MATERIAL

CROSS-REFERENCE TO RELATED APPLICATION

This application claims the benefit of Korean Patent Application No. 10-2017-0062423 filed on May 19, 2017, the disclosures of which are incorporated herein by reference.

TECHNICAL FIELD

The present disclosure relates to an energy conversion material and more particularly to, an energy conversion material in which a property control layer, placed between 2-dimensional active layers, is changed in any one or more of structures and states with an external environmental factor and performs reversible switching so that the 2-dimensional active layers can reversibly use any one or more of photovoltaic, piezoelectric, and thermoelectric properties and thus improve the total energy yield from any available properties mentioned above.

BACKGROUND

A sensor is the core technology for Internet of Things (IoT) which has recently become an issue in the technological fields, and the sensor is a device configured to transmit various information through the Internet, and the domestic and global sensor markets are expected to greatly increase in size.

Such a sensor is supposed to be exposed to various external environments and required to operate for 24 hours. Therefore, it is obvious that the need for an energy source for continuous operation will be increased.

However, the US, Japan, and EU account for 60% or more of the global sensor market, and the domestic sensor-related technologies are insignificant except smartphone-related technologies. Thus, it is important to dominate the continuous operation energy source-related technology which is the core technology for IoT expected to have a high added value.

Meanwhile, the ultimate goal of IoT is to enable interactions among all objects via organic combination between signals input or generated by connection among all the objects. To this end, sensors installed in multiple objects need to continuously interact with each other. Particularly, in case of sudden malfunction in a security device, a medical device, or a factory equipment, the sensors need to notify a user of the malfunction in order to avoid missing the golden time.

The sensors need to be continuously supplied with energy greater than standby power for 24-hour operation. It is expected that by implementing a self-power generating energy source, IoT can be realized in the true sense of the term.

In this regard, a system that generates electric energy using external environmental energy has been actively researched as shown in Korean Patent No. 10-1257318.

However, a conventional energy conversion material is designed to have the maximum energy conversion efficiency in a predetermined environment, but operates only for a limited period of time and thus needs to store electric energy. As such, (i) a conventional energy generating system is an energy generating material based on a single energy conversion mode and generates limited energy for a limited period of time. Further, (ii) the conventional energy generating system can use various energy sources through combination of energy generating modes but is not suitable for an IoT sensor due to the difficulty in micro integration and the need of a complicated circuit for application to a single device.

Accordingly, a new energy conversion material needs to be created in order to overcome the limitations of conventional materials based on a single energy conversion mode.

SUMMARY

In view of the foregoing, the present disclosure provides an energy conversion material in which a property control layer, placed between 2-dimensional active layers, is changed in any one or more of structures and states with an external environmental factor and performs reversible switching so that the 2-dimensional active layer can reversibly use any one or more of photovoltaic, piezoelectric, and thermoelectric properties and thus improve the total energy yield from any available properties mentioned above.

According to a first aspect of the present disclosure, there is provided an energy conversion material including: a pair of 2-dimensional active layers; and a property control layer positioned between the 2-dimensional active layers, and the property control layer is changed in any one or more of structures and states depending on an external environmental factor and performs reversible switching between the 2-dimensional active layers.

According to an embodiment of the present disclosure, the 2-dimensional active layers may have any property selected from the group consisting of photovoltaic, piezoelectric, and thermoelectric properties and combinations thereof according to the reversible switching of the property control layer, but may not be limited thereto.

According to an embodiment of the present disclosure, the 2-dimensional active layers may include a 2-dimensional material or quasi-2 dimensional material selected from the group consisting of transition metal dichalcogenides, graphene, SiC, h-BN, phosphorene, and combinations thereof, but may not be limited thereto.

According to an embodiment of the present disclosure, the graphene may be selected from the group consisting of graphene, graphene oxide, reduced graphene oxide, and combinations thereof, but may not be limited thereto.

According to an embodiment of the present disclosure, the transition metal dichalcogenides may include a transition metal selected from the group consisting of molybdenum (Mo), tungsten (W), titanium (Ti), hafnium (Hf), zirconium (Zr), technetium (Tc), rhenium (Re), platinum (Pt), niobium (Nb), tantalum (Ta), tin (Sn), and combinations thereof, but may not be limited thereto.

According to an embodiment of the present disclosure, the transition metal dichalcogenides may include an element selected from the group consisting of sulfur (S), selenium (Se), tellurium (Te), and combinations thereof, but may not be limited thereto.

According to an embodiment of the present disclosure, the transition metal dichalcogenides may be selected from the group consisting of $MoS_2$, $MoSe_2$, $WS_2$, $WSe_2$, $TiS_2$, $TiSe_2$, $TiTe_2$, $HfS_2$, $HfSe_2$, $HfTe_2$, $ZrS_2$, $ZrSe_2$, $ZrTe_2$, $TcS_2$, $TcSe_2$, $TcTe_2$, $ReS_2$, $ReSe_2$, $ReTe_2$, $PdS_2$, $PdSe_2$, $PtS_2$, $PtSe_2$, and combinations thereof, but may not be limited thereto.

According to an embodiment of the present disclosure, quasi-2 dimensional materials may include an arrayed nanoparticles that becomes the effective two-dimensional layer.

According to an embodiment of the present disclosure, the external environmental factor may be any one or more of light, temperature, and pressure, but may not be limited thereto.

According to an embodiment of the present disclosure, the property control layer may include any one or more of an organic compound whose structure is changed by the external environmental factor and a metal-insulator transition (MIT) material whose state is changed by the external environmental factor, but may not be limited thereto.

According to an embodiment of the present disclosure, the property control layer may include any one selected from the group consisting of combinations of material groups which are changed in structure to an isomer and changed in structure and/or property by light or pressure, but may not be limited thereto.

According to an embodiment of the present disclosure, the isomer may include any one selected from the group consisting of azobenzene, stilbene, spiropyran, fulgide, diarylethene, napthopyran, and combinations thereof, but may not be limited thereto.

According to an embodiment of the present disclosure, the azobenzene may contain an —OH or —SH group as a substituent for p 2 or 6 of a benzene ring, but may not be limited thereto.

According to an embodiment of the present disclosure, the azobenzene may contain a —NHCHO or —COOH group as a substituent for carbon number 4 of a benzene ring, but may not be limited thereto.

According to an embodiment of the present disclosure, the 2-dimensional active layers and the property control layer may be alternately laminated to two or more layers, but may not be limited thereto.

According to an embodiment of the present disclosure, the property control layer may be switched to a photovoltaic conversion mode in the presence of external light and switched to a piezoelectric conversion mode in the absence of external light, but may not be limited thereto.

The above-described embodiments are provided by way of illustration only and should not be construed as liming the present disclosure. Besides the above-described embodiments, there may be additional embodiments described in the accompanying drawings and the detailed description.

According to the above-described aspects of the present disclosure, an energy conversion material itself is changed in any one or more of structure and state depending on an external environmental factor and reversibly uses any one or more of photovoltaic, piezoelectric, and thermoelectric properties and thus improves the energy yield depending on environment change, unlike a conventional hybrid system.

Particularly, the energy conversion material according to the present disclosure can lead to a reversible change of the overall material characteristics through a spontaneous and reversible property change occurring in a sub-unit cell of a property control layer by an exposed environmental factor. Therefore, the energy conversion material can be switched to a certain energy generation mode optimized for a regular or irregular external environmental change.

That is, it is possible to implement a small-sized energy source that can continuously generate energy through spontaneous and reversible switching upon exposed to various environments or energy source in a single device.

As a result, the energy source capable of continuously generating energy using the energy conversion material according to the present disclosure can be used as an essential component to maintain an IoT sensor network.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
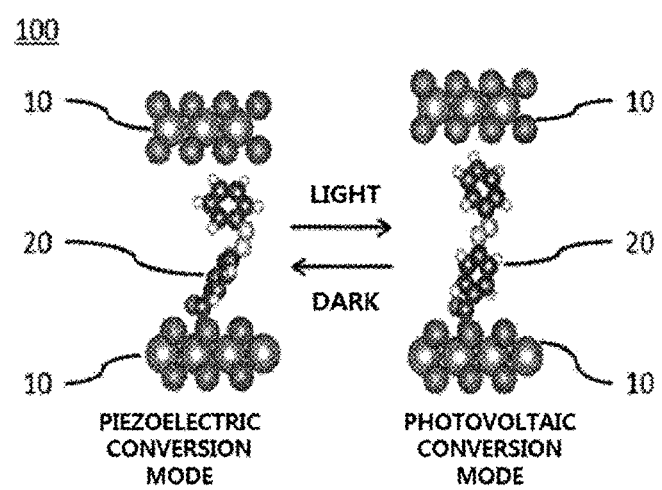
FIG. 1 is a diagram conceptually illustrating the case where azobenzene is applied as a property control layer in an energy conversion material according to the present disclosure.

Hereinafter, embodiments of the present disclosure will be described in detail with reference to the accompanying drawings so that the present disclosure may be readily implemented by those skilled in the art.

However, it is to be noted that the present disclosure is not limited to the embodiments but can be embodied in various other ways. In drawings, parts irrelevant to the description are omitted for the simplicity of explanation, and like reference numerals denote like parts through the whole document.

Through the whole document, the term "connected to" or "coupled to" that is used to designate a connection or coupling of one element to another element includes both a case that an element is "directly connected or coupled to" another element and a case that an element is "electronically connected or coupled to" another element via still another element.

Through the whole document, the terms "on", "above", "on an upper end", "below", "under", and "on a lower end"

that are used to designate a position of one element with respect to another element include both a case that the one element is adjacent to the other element and a case that any other element exists between these two elements.

Further, through the whole document, the term "comprises or includes" and/or "comprising or including" used in the document means that one or more other components, steps, operation and/or existence or addition of elements are not excluded in addition to the described components, steps, operation and/or elements unless context dictates otherwise.

Through the whole document, the term "about or approximately" or "substantially" is intended to have meanings close to numerical values or ranges specified with an allowable error and intended to prevent accurate or absolute numerical values disclosed for understanding of the present disclosure from being illegally or unfairly used by any unconscionable third party. Through the whole document, the term "step of" does not mean "step for".

Through the whole document, the term "combination of" included in Markush type description means mixture or combination of one or more components, steps, operations and/or elements selected from a group consisting of components, steps, operation and/or elements described in Markush type and thereby means that the disclosure includes one or more components, steps, operations and/or elements selected from the Markush group.

Through the whole document, a phrase in the form "A and/or B" means "A or B, or A and B".

Hereinafter, an energy conversion material of the present disclosure will be described in detail with reference to embodiments, examples, and drawings. However, the present disclosure may not be limited to the following embodiments, examples, and drawings.

A first aspect of the present disclosure relates to an energy conversion material including: a pair of 2-dimensional active layers; and a property control layer positioned between the 2-dimensional active layers, and the property control layer is changed in any one or more of structure and state depending on an external environmental factor and performs reversible switching between the 2-dimensional active layers.

Referring to FIG. 1 of the present disclosure, an energy conversion material 100 according to the present disclosure may have a structure including a pair of 2-dimensional active layers 10 and a property control layer 20 positioned between the 2-dimensional active layers 10.

The pair of 2-dimensional active layers 10 are components having basic properties of the energy conversion material 100 according to the present disclosure and may have any one property selected from the group consisting of photovoltaic, piezoelectric, and thermoelectric properties and combinations thereof according to the reversible switching of the property control layer 20 to be described later.

To this end, the 2-dimensional active layers 10 may be any kind of 2-dimensional material, and preferably, the 2-dimensional active layers 10 may include a 2-dimensional material selected from the group consisting of a transition metal dichalcogenides (TMDC), graphene, SiC, h-BN, phosphorene, and combinations thereof, but may not be limited thereto.

According to an embodiment of the present disclosure, the graphene may be selected from the group consisting of graphene, graphene oxide, reduced graphene oxide, and combinations thereof, but may not be limited thereto.

According to an embodiment of the present disclosure, the transition metal dichalcogenides may include a transition metal selected from the group consisting of molybdenum (Mo), tungsten (W), titanium (Ti), hafnium (Hf), zirconium (Zr), technetium (Tc), rhenium (Re), platinum (Pt), niobium (Nb), tantalum (Ta), tin (Sn), and combinations thereof, but may not be limited thereto.

According to an embodiment of the present disclosure, the transition metal dichalcogenides may include an element selected from the group consisting of sulfur (S), selenium (Se), tellurium (Te), and combinations thereof, but may not be limited thereto.

According to an embodiment of the present disclosure, the transition metal dichalcogenides may be selected from the group consisting of $MoS_2$, $MoSe_2$, $WS_2$, $WSe_2$, $TiS_2$, $TiSe_2$, $TiTe_2$, $HfS_2$, $HfSe_2$, $HfTe_2$, $ZrS_2$, $ZrSe_2$, $ZrTe_2$, $TcS_2$, $TcSe_2$, $TcTe_2$, $ReS_2$, $ReSe_2$, $ReTe_2$, $PdS_2$, $PdSe_2$, $PtS_2$, $PtSe_2$, and combinations thereof, but may not be limited thereto.

Particularly, it is to be noted that various materials capable of showing any one of photovoltaic, piezoelectric, and thermoelectric properties can be applied to the 2-dimensional active layers 10.

The property control layer 20 is positioned between the 2-dimensional active layers 10, and the property control layer 20 may be changed in any one or more of structure and state depending on an external environmental factor and may perform reversible switching between the 2-dimensional active layers 10.

Herein, the external environmental factor may be any one or more of light, temperature, and pressure.

Particularly, the property control layer 20 enables voluntary and reversible switching of energy conversion mode of the energy conversion material 100 due to a change in band gap, charge density, polarization, and thermal transfer of the energy conversion material by an external environmental factor.

The property control layer 20 may include any one or more of an organic compound whose structure is changed by the external environmental factor and a metal-insulator transition (MIT) material whose state is changed by the external environmental factor in order to perform the reversible switching.

Particularly, the property control layer 20 only needs to control the 2-dimensional active layers 10 in response to an external stimulus such as light, temperature, and pressure, and to this end, the property control layer 20 may include: i) a control layer including organic molecules; ii) a control layer showing phase transition; and iii) a control layer having structural flexibility.

In the control layer including organic molecules, a material that is switched to a photovoltaic (or thermoelectric or piezoelectric) energy conversion mode by a change in molecular structure induced by light (or temperature or pressure) may be applied, and may include azobenzene, diarylethene, furylfulgide, and the like. In the control layer showing phase transition, a material that is switched to a thermoelectric (or piezoelectric) energy conversion mode by a phase transition induced by temperature (or pressure) may be applied. Further, in the control layer having structural flexibility, a material that makes a change in wrinkle pattern of an active layer due to a structural change by temperature/pressure may be applied.

According to an embodiment of the present disclosure, the property control layer may include any one selected from the group consisting of combinations of material groups which are changed in structure to an isomer and changed in structure and/or property by light or pressure, but may not be limited thereto.

According to an embodiment of the present disclosure, the isomer may include any one selected from the group consisting of azobenzene to which a functional group is attached, stilbene, spiropyran, fulgide, diarylethene, napthopyran, and combinations thereof, but may not be limited thereto.

The spiropyran, fulgide, diarylethene and napthopyran are photoisomers and their molecular ring structures can be opened and closed in response to light. Specifically, the azobenzene is stable in a trans-structure and changed to a cis-structure upon being irradiated with ultraviolet (UV) rays, and the cis-structure has polarity.

Therefore, in order to use cis-azobenzene in a piezoelectric mode in the absence of light, a functional group is attached to adjust a variation direction of azobenzene.

If an —OH or —SH group is attached to carbon number 2 and 6 near a N=N bridge of azobenzene, a variation direction of azobenzene depending on light is changed (changed to a trans-structure by blue light and a cis-structure by green light).

Further, by attaching functional groups (for example, positive pole: —$NH_3$, negative pole: —CN, —$CO_2$, —$OPO_3$, etc.) having opposite charges to both ends, polarity can be formed in a vertical direction. Therefore, the direction of the polarity of the property control layer 20 can be matched with the direction of the polarity of the 2-dimensional active layers 10, thereby improving the piezoelectric mode conversion efficiency.

Further, the azobenzene may contain a —NHCHO or —COOH group as a substituent for carbon number 4 of a benzene ring.

According to an embodiment of the present disclosure, the 2-dimensional active layers and the property control layer may be alternately laminated to two or more layers, but may not be limited thereto.

A structure formed by alternately laminating the 2-dimensional active layers and the property control layer to two or more layers may refer to a structure in which the 2-dimensional active layer-the property control layer-the 2-dimensional active layer (e.g., $MoS_2$/azobenzene/$WSe_2$) are repeated several times.

According to an embodiment of the present disclosure, the structure of the 2-dimensional active layer-the property control layer-the 2-dimensional active layer has a thickness of about 1.5 nm, and, thus, multiple layers may be laminated in the form of $MoS_2$/azobenzene/$WSe_2$, $MoS_2$/azobenzene/$WSe_2$, $MoS_2$/azobenzene/$WSe_2$ or $MoS_2$/azobenzene/$WSe_2$/azobenzene/$MoS_2$/azobenzene/$WSe_2$ to improve the absorption and piezoelectric efficiency.

Further, by controlling the functional groups on the both ends of the property control layer 20, the property control layer 20 and the 2-dimensional active layers 10 are linked to induce p-type and n-type doping of the 2-dimensional active layers 10, and, thus, charges formed by photovoltaic and/or piezoelectric conversion can be separated into the 2-dimensional active layers 10.

Herein, it is to be noted that if a transition metal dichalcogenide (TMD) is used as the 2-dimensional active layers 10, a functional group such as —NHCHO (acetamido) can be used for n-type doping and a functional group such as —$CH_3$ (alkane) or —$SiH_3$ (silane) can be used for p-type doping. In this case, in the transition metal dichalcogenide, hydrogen atoms are separated from functional groups on both ends to form a primary bond at chalcogen vacancies and the number of separated hydrogen atoms determines n-type (1), intrinsic type (2), or p-type (3 or more).

With this configuration, the energy conversion material 100 according to the present disclosure may be switched to a photovoltaic conversion mode in the presence of external light and switched to a piezoelectric conversion mode in the absence of external light, but may not be limited thereto.

Meanwhile, in the present disclosure, the energy conversion material 100 has a structure including the pair of 2-dimensional active layers 10 and the property control layer 20 positioned therebetween. However, it is to be noted that such a structure may be laminated to multiple layers, and, thus, the energy generation efficiency such as absorption of light can be improved.

Hereinafter, the present disclosure will be explained in more detail with reference to Examples. However, the following Examples are illustrative only but do not limit the present disclosure.

<Example 1> Preparation of Energy Conversion Material

Azobenzene-4-carboxylic acid that functions as a molecular switch and expresses piezoelectric properties was laminated in the form of a self-assembled monolayer (SAM) on a surface of $MoS_2$/graphene which is a 2-dimensional transition metal dichalcogenide and $MoS_2$/graphene was transferred thereon to prepare an energy conversion material according to the present disclosure.

Figure 2:
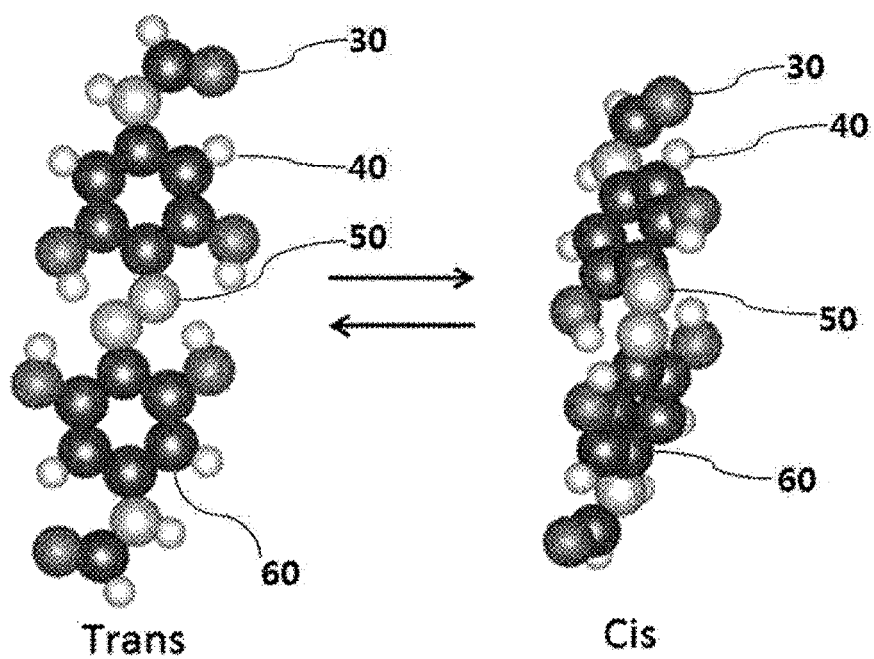
FIG. 2 is a diagram conceptually illustrating the structure of 2,2'-dimethoxy-4,4'-diacetamido-6,6'-dimethoxy-azobenzene.

Referring to FIG. 2, it was confirmed that when the azobenzene had a cis-structure in the prepared energy conversion material, a piezoelectric property was induced to a multilayered 2-dimensional structure having a non-piezoelectric structure due to the polarity of the azobenzene.

Test Example 1

An induced piezoelectric property was checked by measurement of a piezoelectric coefficient using PFM (piezoresponse force microscopy). A piezoelectric coefficient of each of monolayer $MoS_2$, bilayer $MoS_2$, and azobenzene-4-carboxylic acid (AB) inserted $MoS_2$ (AB inserted $MoS_2$) samples was measured using PFM and compared with each other to confirm an improvement in piezoelectric coefficient caused by the insertion of AB.

A photovoltaic property was checked by measurement of a photocurrent using a solar simulator. A current of each of $MoS_2$/graphene and $MoS_2$/azobenzene-4-carboxylic acid/graphene was measured under dark and under 1 sun illumination and compared with each other.

Further, a first-principle calculation using transition metal dichalcogenides, graphene, and an azobenzene-based organic material was performed as follows.

Figure 3:
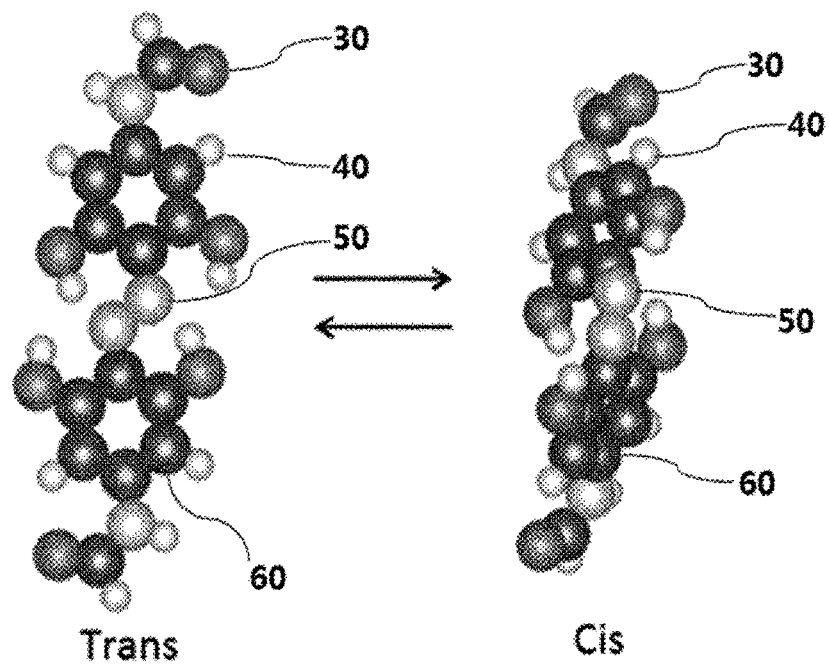
FIG. 3 is a diagram conceptually illustrating the structure of azobenzene-4-carboxylic acid.

In order to replicate a SAM, 2,2'-dimethoxy-4,4'-diacetamido-6,6'-dimethoxy-azobenzene illustrated in FIG. 2 formed a primary bond at S and Se vacancies of 2-dimensional $MoS_2$, $WS_2$ and $WSe_2$ and azobenzene-4-carboxylic acid illustrated in FIG. 3 formed a primary bond at an S vacancy of $MoS_2$ to remove H from an acetamido group and carboxylic acid and were attached thereto.

The first-principle calculation was performed using the GGA-PBE (Generalized Gradient Approximation Perdew Burke Ernzerhof) method, and pseudo potentials of Mo $5s^24d^4$, W $6s^25d^4$, S $3s^23p^4$, Se $4s^2p^4$, C $2s^22p^2$, N $2s^22p^3$, O $2s^22p^4$, and H $1s^1$ were used. A piezoelectric property of the corresponding structure was calculated using the DFPT (Density Functional Perturbation Theory) method, and assuming that each photon was an independent particle, an absorption coefficient was calculated regardless of local field effects.

The piezoelectric coefficients $e_{ij}$ (unit: $10^{-10}$ C/m) of a $WS_2/WSe_2$ bilayer and a $WS_2/WSe_2$ bilayer into which the structure illustrated in FIG. 2 was inserted were as shown in the following Table 1.

TABLE 1

|  | 2H-$WS_2$/$WSe_2$ bilayer | Structure of FIG. 2 inserted |
|---|---|---|
| $e_{11}$ | 0.07 | 34.3 |
| $e_{31}$ | 0.63 | 20.7 |
| $e_{33}$ | 0.05 | 4.08 |

According to Table 1 showing the values of the piezoelectric coefficients obtained by the first-principle calculation, it was confirmed that in the case where the structure of FIG. 2 was inserted between $WS_2$ and $WSe_2$ and had a cis-structure, it had a piezoelectric coefficient ($e_{11}$, $e_{31}$, $e_{33}$) 30 to 500 times higher than the heterogenous bilayer of $WS_2$ and $WSe_2$. Since the cis-structure with polarity among azobenzene isomers was inserted into a van der Waals heterogeneous layered structure of a 2-dimensional material with no polarity or small polarity, a piezoelectric property was given to the entire structure. Particularly, $e_{31}$ and $e_{33}$ had high values of 34.3 pC/m and 20.7 pC/m, respectively, and, thus, the piezoelectric conversion efficiency relatively lower than the photovoltaic conversion efficiency could be improved.

Figure 4:
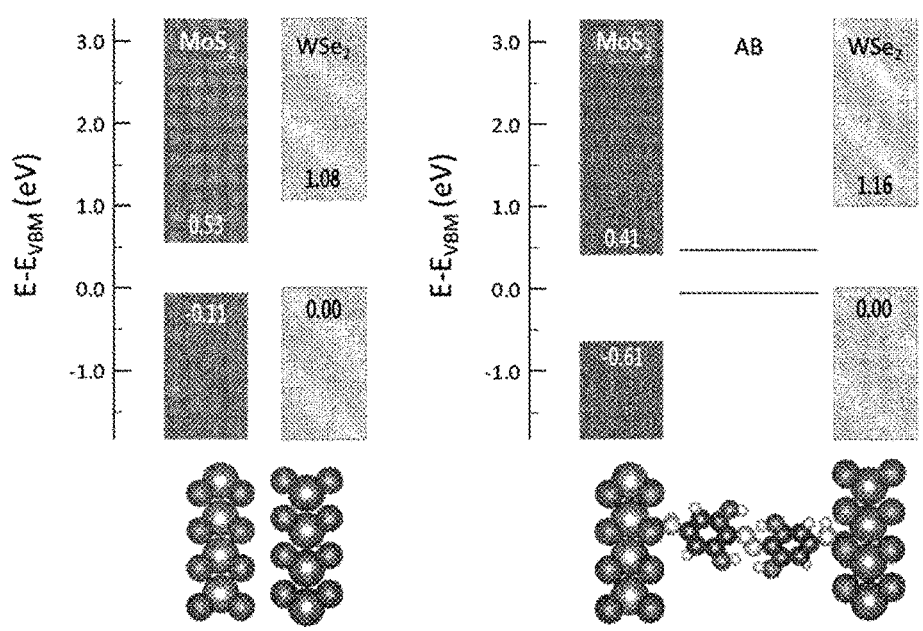
FIG. 4 shows a band bending in a $MoS_2/WSe_2$ bilayer structure caused by the insertion of the structure illustrated in FIG. 2 in an energy conversion material according to the present disclosure.
Figure 5:
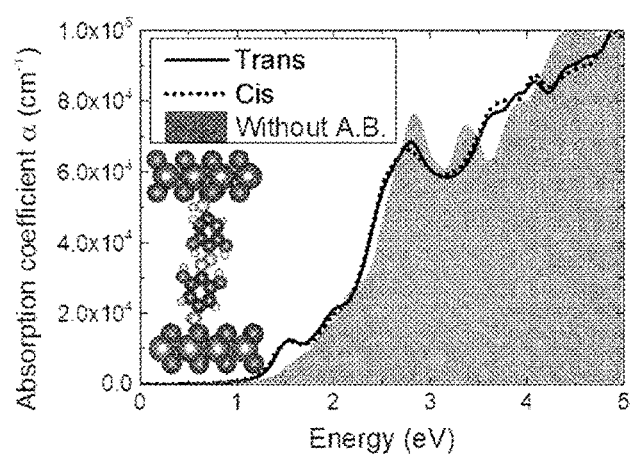
FIG. 5 shows an absorption coefficient change in a $MoS_2/WSe_2$ bilayer structure caused by the insertion of the structure illustrated in FIG. 2 in an energy conversion material according to the present disclosure.

Further, referring to the energy band structures shown in FIG. 4 and the absorption coefficient shown in FIG. 5, it could be seen that energy band bending was intensified by the insertion of azobenzene and had a type-II band alignment, and it could also be seen that the absorption of light having energy of 2.5 eV or less was improved.

Figure 6:
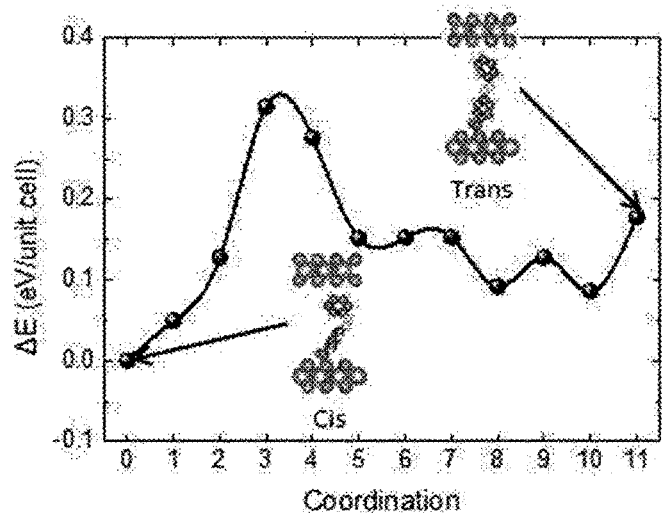
FIG. 6 shows a transition energy barrier in the case where the structure illustrated in FIG. 3 is inserted into a $MoS_2$ bilayer structure in an energy conversion material according to the present disclosure.

Further, energy barriers of 2-dimensional structures with cis-azobenzene-4-carboxylic acid and trans-azobenzene-4-carboxylic acid inserted into $MoS_2$ were checked by NEB (nudged elastic band) calculation. Referring to FIG. 6 as a result thereof, it could be seen that the cis-structure was stable, and, thus, azobenzene-4-carboxylic acid had a cis-structure in the absence of external light and an energy barrier at the time when azobenzene-4-carboxylic acid transitioned from the cis-structure to the trans-structure was 0.35 eV, and, thus, azobenzene-4-carboxylic acid could be converted sufficiently by external light.

Furthermore, a monolayer $MoS_2$ sample, a bilayer $MoS_2$ sample, and an AB inserted $MoS_2$ sample were fabricated and vertical piezoelectric coefficient thereof were measured using PFM.

Figure 7:
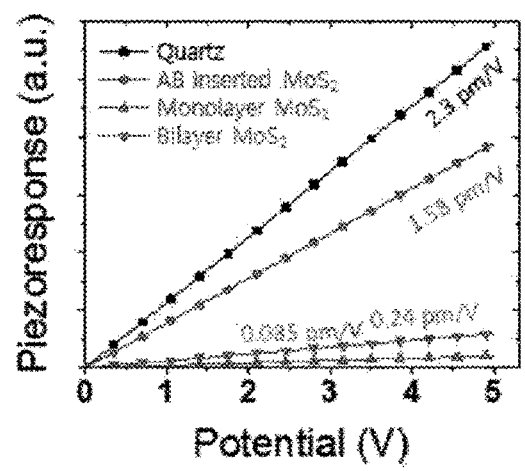
FIG. 7 shows the result of measurement of a piezoelectric coefficient of each device structure in an energy conversion material according to the present disclosure.

The piezoelectric coefficients were measured using an x-cut quartz sample ($d_{11}$=2.3 pm/V) as a reference sample. As a result, the piezoelectric coefficient of the monolayer $MoS_2$ was 0.085 pm/V, the piezoelectric coefficient of the bilayer $MoS_2$ was 0.24 pm/V, and the piezoelectric coefficient of the AB inserted $MoS_2$ was 1.58 pm/V as shown in FIG. 7. It could be seen that the piezoelectric coefficient of the AB inserted $MoS_2$ was sharply increased.

Figure 8:
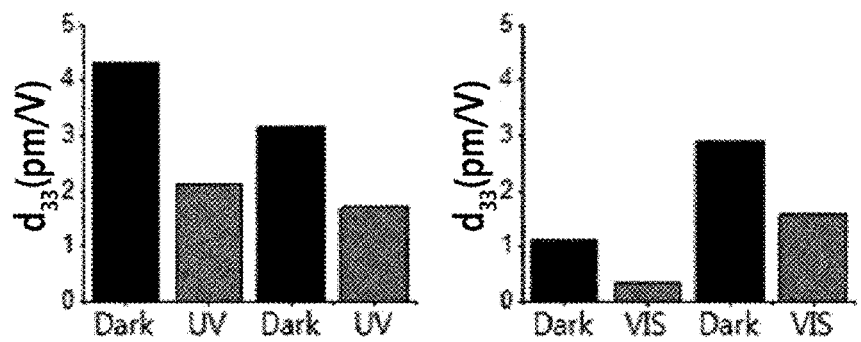
FIG. 8 shows the result of measurement of a piezoelectric coefficient of an energy conversion material depending on incidence of ultraviolet rays and visible rays according to the present disclosure.

In order to check a change in piezoelectric coefficient caused by isomer modification by light, piezoelectric coefficients depending on the presence and absence of UV rays and visible rays were measured. Referring to FIG. 8 as a result thereof, it could be seen that azobenzene-4-carboxylic acid had a cis-structure under dark and thus had a high piezoelectric coefficient as shown in the simulation result, and azobenzene-4-carboxylic acid transitioned to a trans-structure upon being irradiated with UV rays or visible rays, and, thus, the piezoelectric coefficient thereof was decreased.

Test Example 2

Figure 9:
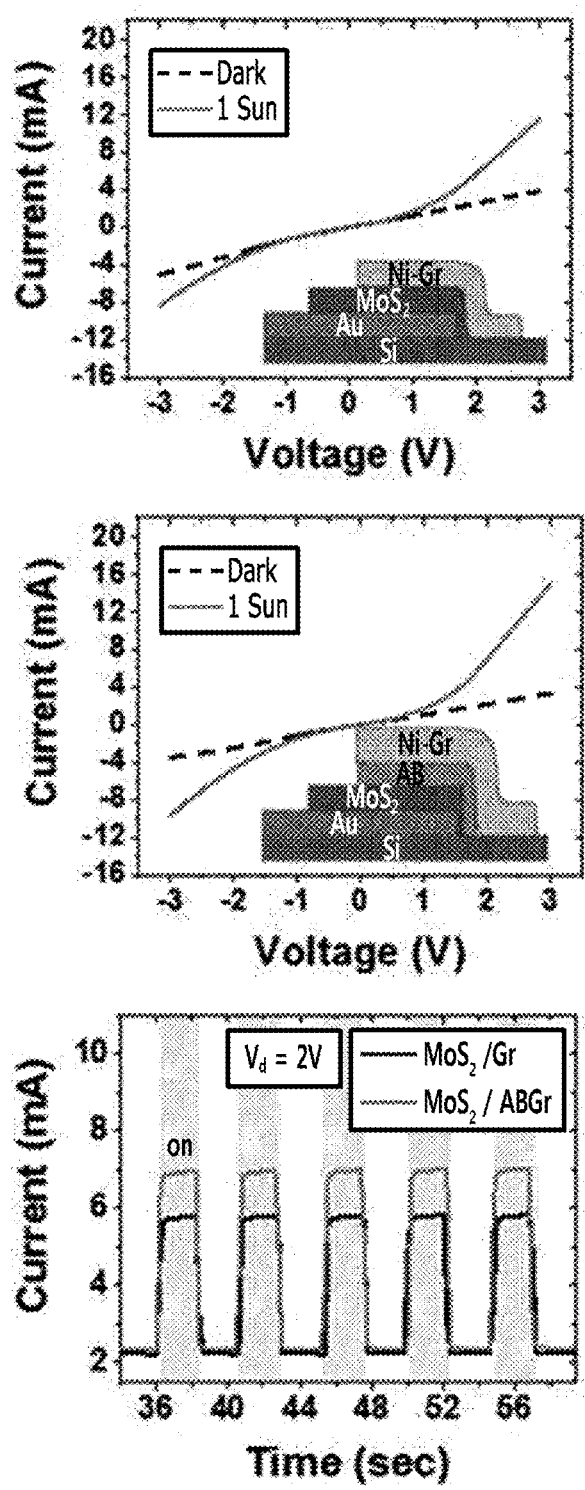
FIG. 9 shows the result of measurement of photovoltaic characteristics of an energy conversion material according to the present disclosure.

In order to measure a photovoltaic property, I-V measurement was performed under 1 sun illumination using a solar simulator. As a result, it could be seen that a graphene/$MoS_2$ lamination showed a photovoltaic property due to $MoS_2$ which is a semiconductor material and in the case where azobenzene-4-carboxylic acid was inserted, azobenzene-4-carboxylic acid transitioned to a trans-structure by light and a photovoltaic property was added by the insertion of AB, and, thus, a photocurrent was improved from 5.8 mA before the insertion of AB to 7 mA after the insertion of AB, as shown in FIG. 9.

Test Example 3

Figure 10:
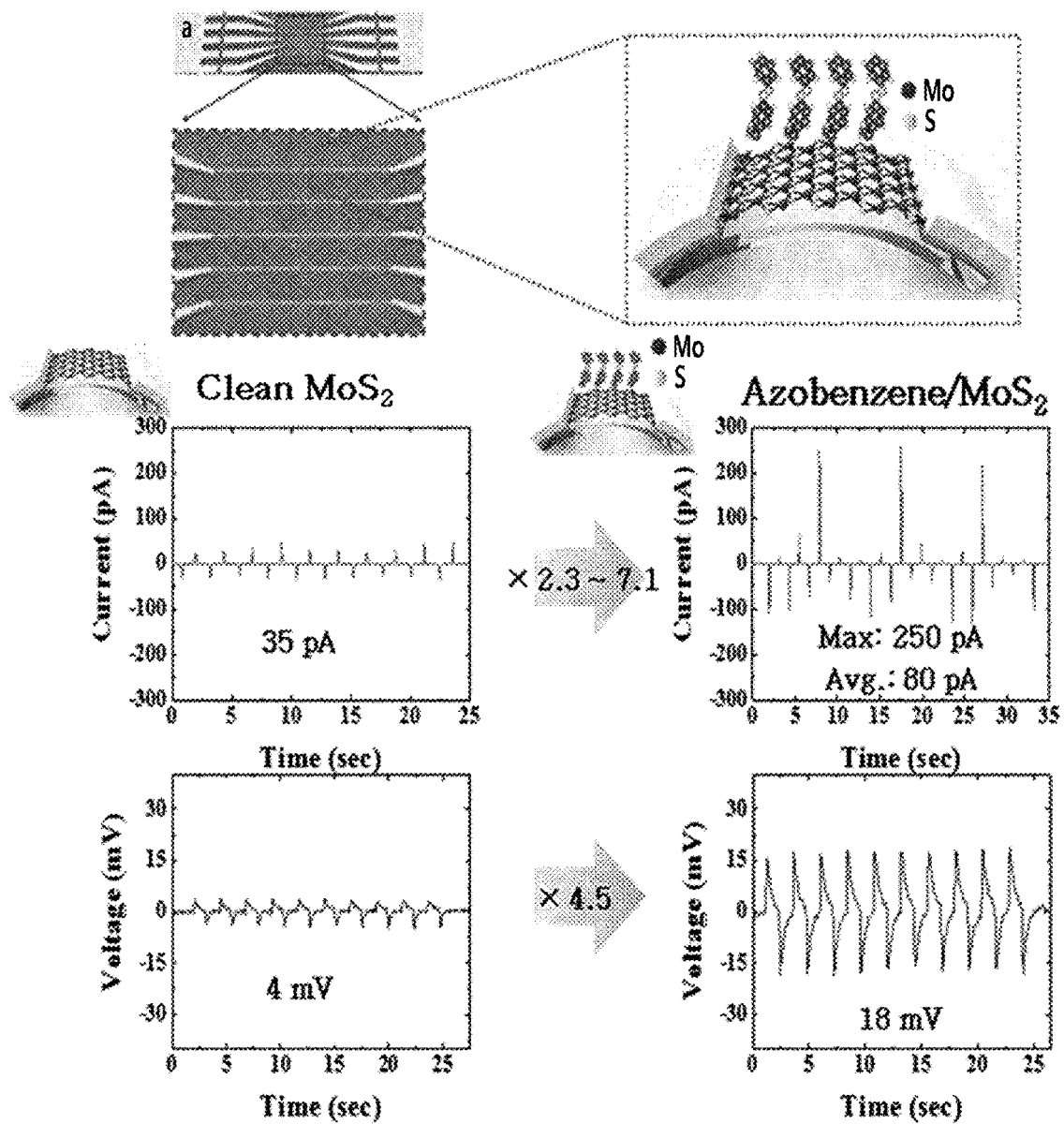
FIG. 10 shows the result confirming the applicability as a device through a bending test of an energy conversion material according to the present disclosure.

Devices were prepared by transferring clean $MoS_2$ and azobenzene-deposited $MoS_2$ onto flexible plastic substrates and depositing electrodes thereon, respectively, and a bending test for measuring the piezoelectric potentials and currents generated when bending the devices using a bending machine was performed. As a result, it was confirmed that azobenzene-deposited $MoS_2$ as the material of the present disclosure showed a higher current and a higher voltage than clean (non-treated) $MoS_2$ in the bending test as shown in FIG. 10. Therefore, it was confirmed that the material of the present disclosure can be more usefully used as a device.

The above description of the present disclosure is provided for the purpose of illustration, and it would be understood by those skilled in the art that various changes and modifications may be made without changing technical conception and essential features of the present disclosure.

Thus, it is clear that the above-described embodiments are illustrative in all aspects and do not limit the present disclosure. For example, each component described to be of a single type can be implemented in a distributed manner. Likewise, components described to be distributed can be implemented in a combined manner. The scope of the present disclosure is defined by the following claims rather than by the detailed description of the embodiment. It shall be understood that all modifications and embodiments conceived from the meaning and scope of the claims and their equivalents are included in the scope of the present disclosure.

| Explanation of Reference Numerals | |
|---|---|
| 100: Energy conversion material | |
| 10: 2-dimensional active layer | |
| 20: Property control layer | 30: Oxygen |
| 40: Hydrogen | 50: Nitrogen |
| 60: Carbon | |

We claim:

1. An energy conversion material, comprising:
   a pair of 2-dimensional active layers including transition metal dichalcogenides; and
   a property control layer positioned between the 2-dimensional active layers and bonded to the 2-dimensional active layers in a vertical direction,
   wherein the property control layer is changed in any one or more of structures and states with an external environmental factor and performs reversible switching between different energy conversion modes, wherein the energy conversion material is switched to a photovoltaic conversion mode in the presence of external light and switched to a piezoelectric conversion mode in the absence of external light, and wherein the property control layer contains one or more functional groups that are attached to both ends of the property control layer, such that the property control layer forms a primary bond with a surface of one of the transition metal dichalcogenides at chalcogen vacancies, and the property control layer and the 2-dimensional active layers are linked to induce p-type or n-type doping of the 2-dimensional active layers, and charges formed by photovoltaic or piezoelectric conversion are separated into the 2-dimensional active layers.

2. The energy conversion material of claim 1, wherein the transition metal dichalcogenides include a transition metal selected from the group consisting of molybdenum (Mo), tungsten (W), titanium (Ti), hafnium (Hf), zirconium (Zr), technetium (Tc), rhenium (Re), platinum (Pt), niobium (Nb), tantalum (Ta), tin (Sn), and combinations thereof.

3. The energy conversion material of claim 1, wherein the transition metal dichalcogenides include an element selected from the group consisting of sulfur (S), selenium (Se), tellurium (Te), and combinations thereof.

4. The energy conversion material of claim 1, wherein the transition metal dichalcogenides are selected from the group consisting of $MoS_2$, $MoSe_2$, $WS_2$, $WSe_2$, $TiS_2$, $TiSe_2$, $TiTe_2$, $HfS_2$, $HfSe_2$, $HfTe_2$, $ZrS_2$, $ZrSe_2$, $ZrTe_2$, $TcS_2$, $TcSe_2$, $TcTe_2$, $ReS_2$, $ReSe_2$, $ReTe_2$, $PdS_2$, $PdSe_2$, $PtS_2$, $PtSe_2$, and combinations thereof.

5. The energy conversion material of claim 1, wherein the external environmental factor is any one or more of light, temperature, and pressure.

6. The energy conversion material of claim 1, wherein the property control layer includes any one or more of an organic compounds whose structure is changed by the external environmental factor or a metal-insulator transition (MIT) material whose state is changed by the external environmental factor.

7. The energy conversion material of claim 1, wherein the property control layer includes any one selected from the group consisting of combinations of material groups which are an isomer and are changed in structure and relevant property by light or pressure.

8. The energy conversion material of claim 7, wherein the isomer includes any one selected from the group consisting of azobenzene, stilbene, spiropyran, fulgide, diarylethene, napthopyran, and combinations thereof.

9. The energy conversion material of claim 8, wherein the azobenzene contains an —OH or —SH group as a substituent for carbon number 2 or 6 of a benzene ring.

10. The energy conversion material of claim 8, wherein the azobenzene contains a —NHCHO or —COOH group as a substituent for carbon number 4 of a benzene ring.

11. The energy conversion material of claim 1, wherein the 2-dimensional active layers and the property control layer are alternately laminated to two or more layers.

12. The energy conversion material of claim 1, wherein the property control layer contains one or more functional groups such as —NHCHO (acetamido), —$CH_3$ (alkane) or —$SiH_3$ (silane) that are attached to both ends of the property control layer.

* * * * *